(12) United States Patent
Gilboa et al.

(10) Patent No.: US 6,969,684 B1
(45) Date of Patent: Nov. 29, 2005

(54) METHOD OF MAKING A PLANARIZED SEMICONDUCTOR STRUCTURE

(75) Inventors: Yitzhak Gilboa, Sunnyvale, CA (US); William W. C. Koutny, Jr., Santa Clara, CA (US); Steven Hedayati, San Jose, CA (US); Krishnaswamy Ramkumar, San Jose, CA (US)

(73) Assignee: Cypress Semiconductor Corp., San Jose, CA (US)

( * ) Notice: Subject to any disclaimer, the term of this patent is extended or adjusted under 35 U.S.C. 154(b) by 513 days.

(21) Appl. No.: 09/846,119

(22) Filed: Apr. 30, 2001

(51) Int. Cl.$^7$ .......................................... H01L 21/302
(52) U.S. Cl. ................ 438/704; 438/424; 438/692; 438/723; 438/717; 438/734; 438/740; 438/750
(58) Field of Search ................ 438/692, 693, 438/704, 723, 717, 734, 750, 740, 424

(56) References Cited

U.S. PATENT DOCUMENTS

| | | |
|---|---|---|
| 3,629,023 A | 12/1971 | Strehlow |
| 3,979,239 A | 9/1976 | Walsh |
| 4,010,583 A | 3/1977 | Highberg |
| 4,193,226 A | 3/1980 | Gill, Jr. et al. |
| 4,256,535 A | 3/1981 | Banks |
| 4,261,791 A | 4/1981 | Shwartzman |
| 4,373,991 A | 2/1983 | Banks |
| 4,393,628 A | 7/1983 | Ottman et al. |
| 4,505,720 A | 3/1985 | Gabor et al. |
| 4,600,469 A | 7/1986 | Fusco et al. |
| 4,677,043 A | 6/1987 | Cordes, III et al. |
| 4,768,883 A | 9/1988 | Waldo et al. |
| 4,778,532 A | 10/1988 | McConnell et al. |
| 4,789,648 A | 12/1988 | Chow et al. |
| 4,811,522 A | 3/1989 | Gill, Jr. |
| 4,879,258 A | 11/1989 | Fisher |
| 4,933,715 A | 6/1990 | Yamada et al. |
| 4,944,836 A | 7/1990 | Beyer et al. |
| 4,954,141 A | 9/1990 | Takiyama et al. |
| 4,956,313 A | 9/1990 | Cote et al. |
| 4,962,423 A | 10/1990 | Yamada et al. |

(Continued)

FOREIGN PATENT DOCUMENTS

EP 0 303 061 2/1989

(Continued)

OTHER PUBLICATIONS

"Improved Planarization for STI with Fixed Abrassive Technology"; Solid State Tech.; 43(6); Vo et al.; pp 123-128; Jun. 2000.*

(Continued)

*Primary Examiner*—George A. Goudreau
(74) *Attorney, Agent, or Firm*—Kevin L. Daffer; Mollie E. Lettang; Daffer McDaniel, LLP

(57) ABSTRACT

A method is provided for eliminating a polish stop layer from a polishing process. In particular, a method is provided which may include polishing an upper layer of a semiconductor topography to form an upper surface at an elevation above an underlying layer, wherein the upper surface does not include a polish stop material. Preferably, the upper surface of the topography formed by polishing is spaced sufficiently above the underlying layer to avoid polishing the underlying layer. The entirety of the upper surface may be simultaneously etched to expose the underlying layer. In an embodiment, the underlying layer may comprise a lateral variation in polish characteristics. The method may include using fixed abrasive polishing of a dielectric layer for reducing a required thickness of an additional layer underlying the dielectric layer. Such a method may be useful when exposing an underlying layer is desirable by techniques other than polishing.

30 Claims, 4 Drawing Sheets

U.S. PATENT DOCUMENTS

| | | |
|---|---|---|
| 4,968,381 A | 11/1990 | Prigge et al. |
| 4,986,878 A | 1/1991 | Malazgirt et al. |
| 5,032,203 A | 7/1991 | Doy et al. |
| 5,057,462 A | 10/1991 | Eisenberg et al. |
| 5,064,683 A | 11/1991 | Poon et al. |
| 5,084,419 A | 1/1992 | Sakao |
| 5,209,816 A | 5/1993 | Yu et al. |
| 5,262,354 A | 11/1993 | Cote et al. |
| 5,273,558 A | 12/1993 | Nelson et al. |
| 5,288,333 A | 2/1994 | Tanaka et al. |
| 5,294,570 A | 3/1994 | Fleming, Jr. et al. |
| 5,312,777 A | 5/1994 | Cronin et al. |
| 5,320,706 A | 6/1994 | Blackwell |
| 5,320,978 A | 6/1994 | Hsu |
| 5,340,370 A | 8/1994 | Cadien et al. |
| 5,346,584 A | 9/1994 | Nasr et al. |
| 5,362,668 A | 11/1994 | Tasaka |
| 5,362,669 A | 11/1994 | Boyd et al. |
| 5,363,550 A | 11/1994 | Aitken et al. |
| 5,376,482 A | 12/1994 | Hwang et al. |
| 5,389,194 A | 2/1995 | Rostoker et al. |
| 5,389,579 A | 2/1995 | Wells |
| 5,392,361 A | 2/1995 | Imaizumi et al. |
| 5,395,801 A | 3/1995 | Doan et al. |
| 5,397,741 A | 3/1995 | O'Connor et al. |
| 5,401,691 A | 3/1995 | Caldwell |
| 5,406,111 A | 4/1995 | Sun |
| 5,421,769 A | 6/1995 | Schultz et al. |
| 5,435,772 A | 7/1995 | Yu |
| 5,436,488 A | 7/1995 | Poon et al. |
| 5,441,094 A | 8/1995 | Pasch |
| 5,453,639 A | 9/1995 | Cronin et al. |
| 5,459,096 A | 10/1995 | Venkatesan et al. |
| 5,468,983 A | 11/1995 | Hirase et al. |
| 5,486,265 A | 1/1996 | Salugsugan |
| 5,492,858 A | 2/1996 | Bose et al. |
| 5,494,857 A | 2/1996 | Cooperman et al. |
| 5,503,962 A | 4/1996 | Caldwell |
| 5,525,840 A | 6/1996 | Tominaga |
| 5,531,861 A | 7/1996 | Yu et al. |
| 5,541,427 A | 7/1996 | Chappell et al. |
| 5,551,986 A | 9/1996 | Jain |
| 5,573,633 A | 11/1996 | Gambino et al. |
| 5,578,523 A | 11/1996 | Fiordalice et al. |
| 5,591,239 A | 1/1997 | Larson et al. |
| 5,595,937 A | 1/1997 | Mikagi |
| 5,602,423 A | 2/1997 | Jain |
| 5,607,345 A | 3/1997 | Barry et al. |
| 5,616,513 A | 4/1997 | Shepard |
| 5,629,242 A | 5/1997 | Nagashima et al. |
| 5,643,406 A | 7/1997 | Shimomura et al. |
| 5,643,823 A | 7/1997 | Ho et al. |
| 5,643,836 A | 7/1997 | Meister et al. |
| 5,652,176 A | 7/1997 | Maniar et al. |
| 5,656,097 A | 8/1997 | Olesen et al. |
| 5,662,769 A | 9/1997 | Schonauer et al. |
| 5,664,990 A | 9/1997 | Adams et al. |
| 5,665,202 A | 9/1997 | Subramanian et al. |
| 5,666,985 A | 9/1997 | Smith, Jr. et al. |
| 5,676,587 A | 10/1997 | Landers et al. |
| 5,695,572 A | 12/1997 | Brunner et al. |
| 5,702,977 A | 12/1997 | Jang et al. |
| 5,721,172 A | 2/1998 | Jang et al. |
| 5,728,308 A | 3/1998 | Muroyama |
| 5,776,808 A | 7/1998 | Muller et al. |
| 5,782,675 A | 7/1998 | Southwick |
| 5,786,260 A | 7/1998 | Jang et al. |
| 5,837,612 A | 11/1998 | Ajuria et al. |
| 5,906,532 A | 5/1999 | Nakajima et al. |
| 5,919,082 A | 7/1999 | Walker et al. |
| 5,928,959 A | 7/1999 | Huckels et al. |
| 5,943,590 A | 8/1999 | Wang et al. |
| 5,952,687 A | 9/1999 | Kawakubo et al. |
| 5,963,841 A | 10/1999 | Karlsson et al. |
| 5,972,124 A * | 10/1999 | Sethuraman et al. ............ 134/7 |
| 5,972,792 A | 10/1999 | Hudson |
| 6,010,964 A | 1/2000 | Glass |
| 6,016,000 A | 1/2000 | Moslehi |
| 6,042,996 A | 3/2000 | Lin et al. |
| 6,063,689 A * | 5/2000 | Chen ......................... 438/424 |
| 6,136,713 A * | 10/2000 | Chen et al. ................. 438/692 |
| 6,143,663 A | 11/2000 | Koutny, Jr. |
| 6,200,896 B1 | 3/2001 | Sethuraman et al. |
| 6,218,267 B1 * | 4/2001 | Liu ........................... 438/431 |
| 6,227,956 B1 * | 5/2001 | Halley ........................ 451/288 |
| 6,265,315 B1 * | 7/2001 | Lee et al. .................... 438/692 |
| 6,435,944 B1 | 8/2002 | Wang et al. |

FOREIGN PATENT DOCUMENTS

JP  11-177058  *  7/1999

OTHER PUBLICATIONS

Ali et al., "Chemical-Mechnical Polishing of Interlayer Dielectric: A Review," *Solid-State Technology*, Oct. 1994, pp. 63-68.

Sivaram et al., "Developments in Consumables Used in the Chemical Mechanical Polishing of Dielectrics," *International Conference on Solid State Devices & Materials*, Aug. 1995, p. 166.

Wolf, *Silicon Processing for the VLSI Era vol. 2: Process Integration*, Lattice Press 1990, pp. 189-191.

Singer, "CMP Developers Take Aim at STI Applications" and "Slurry-Free CMP Reduces Dishing, Speeds Process," *Semiconductor International*, Feb. 1998, vol. 21, No. 2, p. 40.

Malkoe et al., "Effect of Retaining Ring System on the Polishing of 300 mm Oxide-Wafers," Mar. 2001, pp. 519-522.

* cited by examiner

METHOD OF MAKING A PLANARIZED SEMICONDUCTOR STRUCTURE

BACKGROUND OF THE INVENTION

1. Field of the Invention

This invention relates to semiconductor device manufacturing, and more particularly, to an improved method for processing a semiconductor topography.

2. Description of the Related Art

The following descriptions and examples are not admitted to be prior art by virtue of their inclusion within this section.

Forming substantially planar surfaces during the processing of a semiconductor topography may involve numerous fabrication steps. For example, a layer may be formed across a previously patterned layer of a semiconductor topography using a process such as chemical vapor deposition ("CVD"). Elevational disparities of the deposited layer may be reduced by planarizing the layer using a process such as chemical mechanical polishing ("CMP"). Alternatively, an opening or a trench may be formed within a semiconductor topography and subsequently filled with a layer of trench fill material. In this manner, the layer of trench fill material may be formed within the opening and on an upper surface of the semiconductor surface. The layer of trench fill material may then be planarized such that an upper surface of the structure within the trench may be substantially planar with an upper surface of the semiconductor topography.

Substantially planar surfaces within a semiconductor topography may play an important role in the functionality of a semiconductor device. For example, step coverage problems may arise when a dielectric, conductive, or semiconductive material is deposited over a surface having raised and recessed regions. Step coverage is defined as a measure of how well a film conforms over an underlying step and is expressed by the ratio of the minimum thickness of a film as it crosses a step to the nominal thickness of the film over horizontal regions. Furthermore, substantially planar surfaces may become increasingly important as the feature sizes of semiconductor devices are reduced, since the depth of focus required to pattern an upper surface of a topography may increase with reductions in feature size. If a topography is nonplanar, the patterned image may be distorted and the intended structure may not be formed to the specifications of the device. Furthermore, correctly patterning layers upon a surface containing fluctuations in elevation may be difficult using optical lithography. The depth-of-focus of the lithography alignment system may vary depending upon whether the resist resides in an elevational "hill" or "valley" area.

As mentioned above, CMP is a technique that may be employed to planarize or remove the elevational fluctuations in the surface of a semiconductor topography. A conventional CMP process may involve placing a semiconductor wafer face-down on a polishing pad which lies on or is attached to a table or platen. During the CMP process, the polishing pad and/or the semiconductor wafer may be set into motion as the wafer is forced against the pad. For example, the polishing pad and the wafer may be placed on rotatable tables such that the wafer and the polishing pad may be rotated relative to each other. Alternatively, the wafer may be rotated relative to a fixed pad or vice versa. In another embodiment, the polishing pad may be a belt, which traverses against a fixed or rotating wafer. An abrasive, fluid-based chemical suspension, often referred to as a "slurry," may be deposited onto the surface of the polishing pad. The slurry fills the space between the polishing pad and the wafer surface such that a chemical in the slurry may react with the surface material being polished. The rotational movement of the polishing pad relative to the wafer causes abrasive particles entrained within the slurry to physically strip the reacted surface material from the wafer. Therefore, the process may employ a combination of chemical stripping and mechanical polishing to form a planarized surface.

Unfortunately, a CMP process may not form a substantially planar surface across the entire semiconductor topography. For instance, the slurry may react in recessed regions, causing those regions to be excessively etched. Furthermore, the polishing rate of the CMP may be dependent upon the polish characteristics of the topography. As a result, the polishing pad, being somewhat conformal to the surface topography, may deform in response to polishing laterally adjacent layers comprising different polish properties. Therefore, while the removal rate of raised regions of the dielectric may be greater than that of the recessed regions, a significant amount of the recessed regions may, unfortunately, undergo removal. This phenomena is known as the "dishing" effect and may reduce the degree of planarization that can be achieved by the CMP process. Consequently, the "dishing" effect may cause upper surfaces of structures and layers to curve below polished upper surfaces of adjacent structures or layers. For example, relatively shallow trench isolation regions are typically formed within a semiconductor substrate to isolate impurity regions of active devices placed in the substrate. The dishing effect may be so severe that some portions of the upper surface of the shallow trench isolation regions may extend below the upper surface of the substrate by approximately 500 angstroms. As a result, the active regions of the device may not be adequately isolated.

To insure that the upper surfaces of isolation regions are above or coplanar with upper surfaces of adjacent active regions, a polish stop layer may be used to terminate the polishing process at an elevation above the semiconductor substrate. The composition of the polish stop layer is such that it polishes much more slowly than the layer above it. In this manner, polishing may be substantially terminated upon exposing the polish stop layer. Thus, layers or structures formed upon the semiconductor topography adjacent to the polish stop layer may also be polished to approximately the same elevation level as the polish stop layer. Silicon nitride is typically used as a polish stop layer since it is a relatively hard material, particularly compared to silicon dioxide.

As such, a technique with which to form shallow trench isolation regions may include depositing a layer of silicon nitride ("nitride") across an upper surface of a semiconductor substrate. A "pad" oxide layer is typically interposed between the substrate and nitride layer to reduce inherent stresses between nitride and silicon. Portions of the nitride layer and substrate are etched away to define a trench within the substrate. Fill oxide (i.e., silicon dioxide) is then deposited into the trench to a level spaced above the upper surface of the nitride layer. The resulting upper surface of the fill oxide includes a recessed region elevationally raised above the trench area. A trench isolation region may then be formed by subjecting the semiconductor topography to a CMP process. The polish rate of the nitride layer is so slow that the nitride layer acts as a polish stop layer. Subsequent to the CMP process, the nitride layer may be removed by a nitride strip followed by a selective etch technique to remove the pad oxide.

A disadvantage of the polish stop process described above is a problem known as the "dishing effect". During the CMP process, the slurry, being a relatively viscous fluid, may flow to the recessed region of the fill oxide. Further, the polishing pad, being somewhat conformal to the semiconductor topography, may deform above the recessed region in response to the polishing characteristic differences between the fill oxide and nitride layer. Consequently, the fill material may be undesirably "dug out" of some trenches and thus, the "dishing effect" may be observed. The "dishing effect" may be further augmented by "overpolishing" the polish stop layer. It is important to remove all fill oxide above the nitride layer for subsequent removal of the polish stop layer. Therefore, the surface may be "overpolished" or polished to a level spaced below the original upper surface of the nitride layer to ensure that the fill oxide no longer resides above the nitride layer. Furthermore, the dishing effect may be dependent on pattern density. For example, a pattern having relatively few and/or relatively narrow isolation trenches may include a large amount of nitride across the lateral portion of the topography, which results in a slower polish rate. Alternatively, patterns having relatively many and/or wide isolation trenches may include less nitride across the lateral surface of the semiconductor topography, resulting in a faster polish rate and a thicker amount of nitride needed to compensate for the increase in the polish rate.

It is, therefore, advantageous to form a polish stop layer having a sufficient thickness such that the "dishing effect" does not extend below the upper most surface of the substrate subsequent to polishing. Typically, the thickness of the polish stop layer may be greater than 500 angstroms and possibly greater than 1000 angstroms. Unfortunately, the use of a relatively thick polish stop layer may create a significant step height between the resulting shallow trench isolation region and adjacent regions upon removal of the polish stop layer. The "step height" as used herein refers to the upper portion of the shallow trench isolation region that extends above the upper surface of adjacent regions. Such a step height may have a thickness between approximately 500 angstroms and approximately 2000 angstroms. Unfortunately, this step height may be significant enough to cause the aforementioned problems associated with non-planar surfaces. In addition, incomplete removal of subsequently deposited polysilicon at step edges may result in the formation of "poly stringers" in subsequent processing, which may adversely affect the performance of the circuit. Furthermore, since the nitride layer increases the depth of the trench which must be filled by the fill oxide, a thicker fill oxide is needed. Such a formation of a relatively thick fill oxide above the nitride layer can be rather time-consuming and costly.

Accordingly, it would be advantageous to develop a method for forming a semiconductor topography having a substantially planar upper surface across the entire semiconductor topography. In particular, it would advantageous to reduce the thickness of or eliminate a polish stop layer for the formation of a substantially planar surface.

SUMMARY OF THE INVENTION

The problems outlined above may be in large part addressed by a method for processing a semiconductor topography. In particular, a method is provided in which a polish stop layer may be eliminated from a polishing process. Such a method may include polishing an upper layer of a semiconductor topography to form an upper surface at an elevation above an underlying layer, wherein the upper surface does not include a polish stop material. Preferably, the upper surface of the topography formed by polishing is spaced sufficiently above the underlying layer to avoid polishing the underlying layer. The entirety of the upper surface may be simultaneously etched to expose the underlying layer. In an embodiment, the underlying layer may comprise a lateral variation in polish characteristics. In other words, the layer may include a variation in material composition, in which the different materials polish differently. For example, the underlying layer may include a silicon substrate patterned with dielectric filled trenches. In another embodiment, the underlying layer may include silicon nitride laterally interspersed with silicon dioxide. In yet another embodiment, the underlying layer may include conductive regions laterally interspaced with dielectric regions.

In an embodiment, a method for processing a semiconductor topography may include using fixed abrasive polishing of a dielectric layer for reducing a required thickness of an additional layer underlying the dielectric layer. The dielectric layer may include an interlevel dielectric or a trench fill layer for shallow trench isolation regions. The fixed abrasive polishing process may include applying a fluid substantially free of particulate matter between the semiconductor topography and an abrasive polishing surface. The additional layer may be used, for example, as a step-definition layer. In particular, the additional layer may be used to form a layer with step heights of less than approximately 200 angstroms. In such an embodiment, the additional layer may have a reduced thickness of less than approximately 500 angstroms, or more preferably approximately 150 angstroms or less. In another embodiment, the additional layer may be completely eliminated. Furthermore, the additional layer may have different polishing characteristics than that of the dielectric layer. For example, in an embodiment in which the dielectric layer includes silicon dioxide, the additional layer may include silicon nitride or another material which has different polishing characteristics than that of silicon dioxide. The method may further include etching the dielectric layer subsequent to polishing the dielectric layer. Such a method may be useful when exposing an underlying layer is desirable by techniques other than polishing. For example, the method herein may be particularly useful for shallow trench isolation formation or planarizing interlevel dielectric layers.

In an embodiment, the method for processing a semiconductor topography may include polishing an upper layer of said semiconductor topography to form a polished upper surface of the semiconductor topography at an elevation above an underlying layer that includes a lateral variation of polishing characteristics. The method may further include etching the entirety of the upper surface of the semiconductor topography simultaneously to expose the underlying layer. In this manner, the entire lateral upper surface of the semiconductor topography may be etched at one time. This is in contrast to an etch step performed after polishing down to a polish stop, since such an etch step selectively etches the polish stop portion of the upper surface and not the adjacent portions. In one embodiment, the upper layer may include an interlevel dielectric layer. The interlevel dielectric layer may include silicon dioxide, silicon nitride, silicon carbide, or carbonated polymers. Preferably, the polished upper surface of the semiconductor topography is spaced sufficiently above the underlying layer to avoid dishing during polishing. In general, the polished upper surface of the semiconductor topography may be spaced sufficiently above the underlying layer to avoid polishing the underlying layer. For example, the upper surface may be formed above the underlying layer at an elevation between approximately 100 angstroms and approximately 1000 angstroms. In one embodiment, the polishing process may include a fixed abrasive polishing process. Such a polishing process may form a substantially planar upper surface. The underlying layer may include a silicon substrate patterned with dielectric filled trenches or silicon nitride regions laterally interspersed with silicon dioxide regions. Alternatively, the underlying layer may include conductive regions interspersed with dielectric regions.

Terminating the polishing process at an elevation above a patterned layer of materials, which include a variation of polishing characteristics, may prevent the occurrence of dishing of the patterned layer during the polishing process. Therefore, the polishing process may be designed to terminate at an elevation above such an underlying layer. For example, the polishing process may be programmed to polish for a predetermined period of time. In one embodiment, a substantially planar surface may not be formed upon termination of the polishing process if the thickness of overlying layers is not sufficient to form a substantially planar surface during the polishing process. In such an embodiment, the upper surface of the semiconductor topography formed by polishing may comprise materials with a variation of etch characteristics (though not a variation of polish characteristics). As such, a substantially planar surface may be obtained subsequent to the etch process. Alternatively, the overlying layers may be thick enough for the polishing process to form a substantially planar surface spaced above an underlying layer.

In an embodiment, the polishing rate may be significantly reduced when a substantially planar surface is formed. Such a polishing process may include a fixed abrasive polishing process, which is a polishing process in which abrasive material is fixed into the polishing pad rather than being suspended in a liquid to form a slurry. A fixed abrasive process may be achieved by modification of a CMP process. However, contrary to some CMP processes, the polishing rate of the fixed abrasive polishing process is significantly reduced upon forming a substantially planar surface. As such, a fixed abrasive polishing process may be programmed to run longer than a CMP process. Such an over polishing technique may be used to insure that a substantially planar surface has been obtained. Alternatively, the polishing process may be designed to automatically terminate upon indication of a significant reduction in the polishing rate. Consequently, the method as described herein may be designed such that the upper surface of the semiconductor topography subsequent to polishing may be spaced sufficiently above an underlying layer to avoid polishing the underlying layer. Furthermore, the thickness of the upper layer upon deposition may be optimized to allow the polishing process to terminate on its own, and yet minimize the elevation above an underlying layer subsequent to polishing. In one embodiment, the upper surface of the semiconductor topography subsequent to polishing may be spaced above an underlying layer by an amount between approximately 100 angstroms and approximately 1000 angstroms. Preferably, the upper surface of the semiconductor topography subsequent to polishing may be approximately 500 angstroms above the underlying layer. As such, such a polishing process may eliminate the use of a polish stop layer. In this manner, the upper surface of the semiconductor topography formed subsequent to polishing may not include a polish stop material.

The etch process may include a single etch step or a series of etch steps. In either embodiment, the method may include an initial etch step which etches the entire lateral upper surface of the semiconductor topography at one time. In this manner, a non-selective removal of exposed material across the semiconductor topography may be conducted simultaneously. In addition to the initial etch step, other etch steps may be employed. For example, if silicon nitride is interposed between the upper surface of the semiconductor topography and an underlying layer, a separate nitride etch step may be required to remove portions of the nitride after the initial etch step. A further etch step may be needed after the nitride strip to remove other material remaining above the underlying layer. In an embodiment in which the underlying layer includes a lateral variation in polishing characteristics, the etch process allows the underlying layer to be exposed, but does not produce dishing of the underlying layer as may occur when polishing a layer including materials with different polishing characteristics.

The method as described herein may be used for the fabrication of shallow trench isolation regions. In such an embodiment, a trench fill material may be blanket deposited over a semiconductor topography comprising one or more trenches. Preferably, the entirety of the upper surface of the deposited trench fill material is spaced above the portion of the trench within the semiconductor substrate, such that an upper surface of the semiconductor topography subsequent to a polishing process may be formed at an elevation above the semiconductor substrate. Furthermore, the upper surface of the semiconductor topography subsequent to polishing preferably does not include a polish stop material. The polishing process may include a fixed abrasive polishing process as described above. The entirety of the planar surface may be simultaneously etched such that remaining portions of the trench fill material subsequent to etching are laterally confined within the trenches. The etch process may include a single etch step or a series of etch steps as discussed above.

Such a process may produce shallow trench isolation regions that are substantially coplanar with laterally adjacent regions. In this manner, the upper surface of the trench fill material subsequent to etching may be substantially coplanar with the upper surface of the semiconductor substrate. Alternatively, a step height may be formed between the trenches and adjacent regions during the etch process due to a variation in etch rate characteristics of layers positioned upon the underlying layer. The step height may be positive or negative depending on the etch rate properties of the materials etched. As such, the upper surface of the trench fill material subsequent to etching may be below or above the upper surface of the semiconductor topography. More specifically, the upper surface of the trench fill material subsequent to etching may be less than approximately 200 angstroms above the upper surface of the semiconductor topography. Preferably, the upper surface of the trench fill material subsequent to etching may be less than approximately 50 angstroms above the upper surface of the semiconductor topography.

In an embodiment, an intermediate layer may be formed upon an upper surface of the semiconductor topography prior to depositing the trench fill material. Such an intermediate layer may help to achieve a desired step height of the trench fill material above the substrate at the end of the shallow trench isolation process. As such, the intermediate layer may be formed upon the upper surface of the semiconductor topography adjacent to the trenches. In this manner, the intermediate layer may be interposed between the underlying layer and the trench fill material in regions of the topography adjacent to the trenches. Therefore, the intermediate layer may be polished and/or etched in conjunction with the process as described herein. The intermediate layer may include, for example, a base oxide layer. In one embodiment, the intermediate layer may have a different etch rate than the trench fill material. For instance, the intermediate layer may include a doped oxide layer, such as borosilicate, borophosphosilicate glass (BPSG), phosphosilicate glass (PSG), fluorinated silicate glass, or any combination of silicon dioxide with elements from columns 3 and 5 of the periodic table. Alternatively, the intermediate layer may include a nitride layer. In such an embodiment, the thickness of the nitride layer may be less than approximately 500 angstroms. More specifically, the nitride layer may have a thickness between approximately 100 angstroms and approximately 200 angstroms. Furthermore, the intermediate layer may include either a layer of silicon carbide or carbonated polymer. Such layers, as with the doped oxide layer or nitride layer, may be arranged upon a layer of base oxide.

In an embodiment, the method for processing a semiconductor topography may include using a fixed abrasive polishing process for eliminating the use of a polish stop layer. In particular, the method may be used to polish a dielectric layer. The dielectric layer may include an interlevel dielectric or a trench fill layer for formation of shallow trench isolation regions. For instance, the method may be used to fabricate a shallow trench isolation region without the use of a polish stop layer, such that an upper surface of the isolation region may be elevationally above the upper surface of the surrounding substrate. In particular, the upper surface of the isolation region may be less than approximately 200 angstroms above the upper surface of the surrounding substrate. The fixed abrasive polishing process may include applying a fluid substantially free of particulate matter between the semiconductor topography and an abrasive polishing surface. In an embodiment, the fixed abrasive polishing process may form a substantially planar surface at an elevation above the semiconductor substrate. In such an embodiment, the planar surface may include the trench fill material. The method may further include etching the entirety of the planar surface simultaneously after the fixed abrasive polishing process. The planar surface may include a lateral variation of materials, where the materials have different etch characteristics. In addition, the etching process may include etching an intermediate layer, which is interposed between the planar surface and the substrate. The intermediate layer may also include materials of different etch characteristics.

There may be several advantages to eliminating the use of a polish stop layer, and in some embodiments replacing it with a step-definition layer. For example, a shallow trench isolation region having a reduced step height may be formed. Such a benefit offers the formation of a substantially planar upper surface upon a semiconductor topography. In this manner, additional structures and layers may be formed within design specifications of the device. Furthermore, step coverage problems and lithography problems may be minimized. The method as described herein may also minimize pattern density constraints since the "dishing effect" is reduced. Other benefits may include a decrease in material use with a reduction in thickness of the upper layer and the elimination of the polish stop layer. Furthermore, the number of processing steps may be reduced. Such reductions and eliminations may reduce processing time, thereby increasing production throughput. Material costs and labor costs may also be reduced.

BRIEF DESCRIPTION OF THE DRAWINGS

Other objects and advantages of the invention will become apparent upon reading the following detailed description and upon reference to the accompanying drawings in which.

Figure 1:
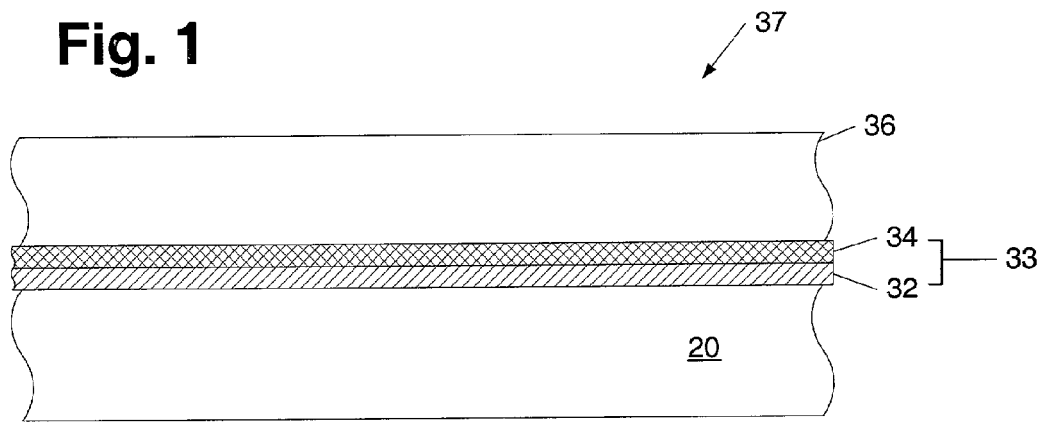
FIG. 1 depicts a partial cross-sectional view of a semiconductor topography in which an intermediate layer and a resist layer are formed upon a semiconductor layer.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE PREFERRED EMBODIMENTS

Turning to the drawings, exemplary embodiments of a method for processing a semiconductor topography are shown in FIGS. 1–12. In particular, a method is provided in which a polish stop layer may be eliminated from a polishing process. FIG. 1 depicts semiconductor topography 37 in which dielectric 32 may be formed upon semiconductor layer 20. Moreover, layer 34 may be formed upon dielectric 32, and resist 36 may be formed upon layer 34. Layers 32 and 34 may together form intermediate layer 33. Alternatively, intermediate layer 33 may include only either dielectric 32 or layer 34. In such an embodiment, the layer not included in intermediate layer 33 may be omitted. In particular, layer 34 may be omitted and thus resist layer 36 may be formed upon and in contact with underlying dielectric 32. Moreover, layer 34 may be formed upon and in contact with semiconductor layer 20 if dielectric 32 is omitted. In contrast, intermediate layer 33 may be omitted (omitting both layers 32 and 34) from FIG. 1, such that resist layer 34 may be formed upon and in contact with semiconductor layer 20.

Semiconductor layer 20 may be a semiconductor substrate such as a silicon substrate, and may be doped either n-type (for producing a p-channel transistor) or p-type (for an n-channel transistor). More specifically, semiconductor layer 20 may be an epitaxial silicon layer grown on a monocrystalline silicon substrate, or an n-type or p-type well region formed in a monocrystalline silicon substrate. Alternatively, semiconductor layer 20 may include structures and layers formed upon a semiconductor substrate, such as a monocrystalline silicon semiconductor substrate. The structures and layers may include, but are not limited to, gate dielectric layers, gate structures, contact structures, local interconnect wires, additional dielectric layers, or metallization layers. In this manner, semiconductor layer 20 may be substantially planar or may have substantial elevational differences due to the formation of such structures and layers. Doped regions (not shown) may also be formed in semiconductor layer 20. For example, doped regions may be lightly doped drain regions and heavily doped source/drain regions formed in a semiconductor layer adjacent to gate structures.

Dielectric 32 may serve as a "pad oxide" to reduce inherent stresses between an overlying layer and semiconductor layer 20. In another embodiment, dielectric 32 may also promote adhesion of an overlying layer upon semiconductor layer 20. Dielectric 32 may be grown upon semiconductor layer 20 using wet or dry thermal oxidation of a silicon substrate. Alternatively, dielectric 32 may be deposited on semiconductor layer 20 using chemical-vapor deposition ("CVD") from, for example, a gas that may include $SiH_4$ and $O_2$. Typically, thermally grown oxides etch at a slower rate than deposited oxides. Therefore, the selection of the oxide formation technique may depend on the etch characteristics needed in the subsequent etching process. Dielectric 32 may have a thickness, for example, between approximately 50 angstroms to approximately 250 angstroms. Dielectric 32 may include a dielectric material, such as silicon dioxide ($SiO_2$), silicon oxynitride ($SiO_xN_y(H_x)$), or silicon dioxide/silicon nitride/silicon dioxide (ONO).

Layer 34 may serve to protect portions of underlying layers and structures within semiconductor layer 20. For example, layer 34 may protect portions of dielectric 32 and semiconductor layer 20 from an etch process which may be used to form trenches within semiconductor layer 20. Alternatively or in addition, layer 34 may serve as a step-definition layer. In this manner, layer 34 may be used to subsequently form a layer including step heights. In a preferred embodiment, the step heights may be less than approximately 200 angstroms. As such, layer 34 may have, for example, a thickness of approximately 50 angstroms to approximately 500 angstroms and preferably approximately 150 angstroms. Appropriate materials for layer 34 may include any material having a substantially different etch rate than upper layer 42. In particular, layer 34 may comprise a material having a lower etch rate than that of upper layer 42 discussed in the description of FIG. 4 below. On the other hand, layer 34 may be a doped dielectric layer, which may have a higher etch rate than that of upper layer 42. In particular, layer 34 may include any combination of silicon dioxide with elements from columns 3 and 5 of the periodic table. For example, layer 34 may include borophosphorus silicate glass (BPSG) or phosphorus silicate glass (PSG). In an embodiment, BPSG may have a boron concentration of less than approximately 5% by weight. PSG may have a phosphorus concentration of less than approximately 10% by weight, and more preferably less than approximately 5% by weight. In other embodiments, layer 34 may include either silicon carbide or carbonated polymer. Alternatively or in addition, layer 34 may include a material having different polishing characteristics than that of upper layer 42 of FIG. 4. For instance, layer 34 may include silicon nitride deposited by thermally decomposing silane and ammonium in a chemical vapor deposition process maintained at a temperature in the range of approximately 200° C. to approximately 800° C.

Figure 2:
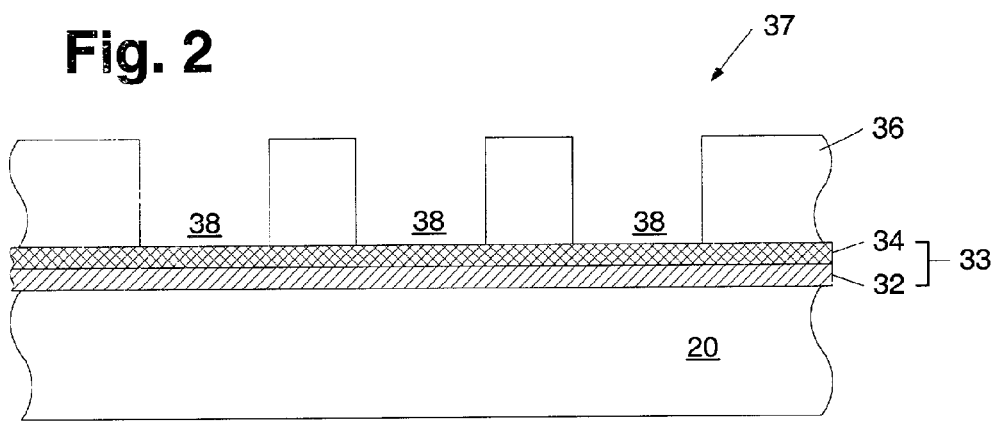
FIG. 2 depicts a partial cross-sectional view of the semiconductor topography in which the resist layer is patterned subsequent to the layer formations of FIG. 1.
Figure 3:
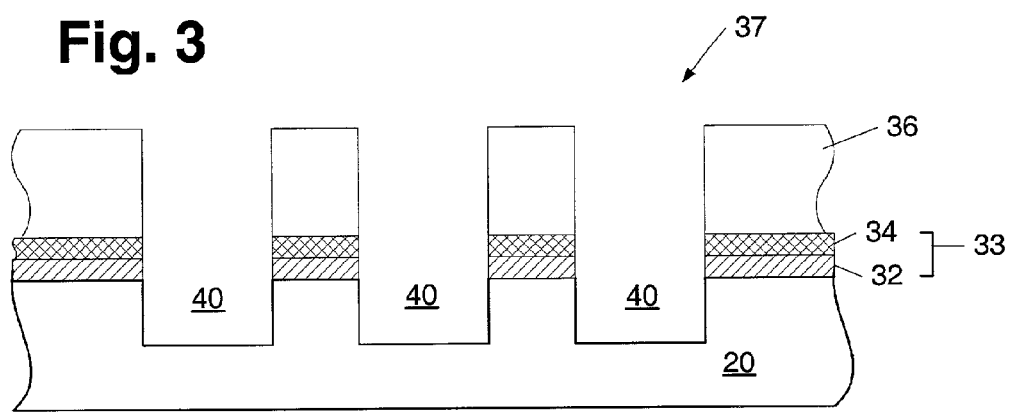
FIG. 3 depicts a partial cross-sectional view of the semiconductor topography in which trenches are formed within the intermediate layer and semiconductor layer subsequent to the resist layer patterning of FIG. 2.

In an embodiment, resist 36 may be formed upon layer 34. Resist 36 may include a photoresist, such as a deep ultraviolet resist, an I-line resist, a G-line resist, or another resist, such as an e-beam resist or an x-ray resist. Resist 36 may be patterned using a lithography technique, thus exposing portions 38 of layer 34 as shown in FIG. 2. Exposed portions 38 of layer 34 and underlying portions of dielectric 32 and semiconductor layer 20 may be etched to form trenches 40 as shown in FIG. 3. The etch process may include wet etch and/or dry etch techniques. The patterned photoresist may then be removed by a stripping process such as a wet etch or a reactive ion etch stripping process. Trenches 40 may be used to subsequently form shallow trench isolation regions within semiconductor layer 20. Isolation regions may be field oxide regions, which may serve to isolate separate active regions on semiconductor layer 20 from one another.

Figure 4:
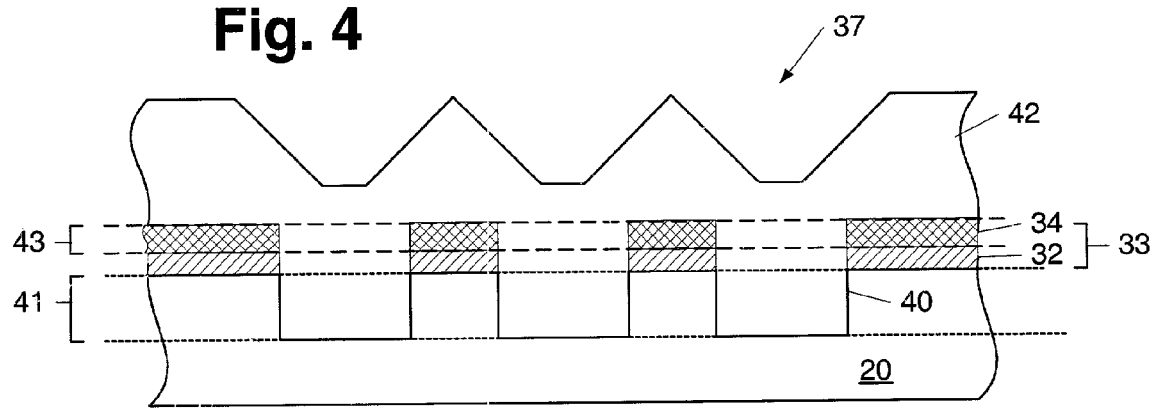
FIG. 4 depicts a partial cross-sectional view of the semiconductor topography in which an upper layer is formed within the trenches and above the intermediate layer subsequent to the trench formation of FIG. 3.

Turning to FIG. 4, trenches 40 may be filled with upper layer 42. Upper layer 42 may also be formed upon layer 34, which may be formed adjacent to trenches 40. Alternatively, upper layer 42 may be formed upon and in contact with dielectric 32 if layer 34 is omitted from the embodiment. In another embodiment, upper layer 42 may be formed upon and in contact with semiconductor layer 20 if intermediate layer 33 is omitted. Upper layer 42 may include a material including different polishing characteristics than that of semiconductor layer 20. For example, upper layer 42 may include a polymetal dielectric layer or an intermetal dielectric layer. Thus, upper layer 42 may include silicon dioxide ($SiO_2$), silicon nitride ($Si_xN_y$), silicon oxynitride ($SiO_xN_y(H_z)$), silicon dioxide/silicon nitride/silicon dioxide (ONO), silicon carbide, or carbonated polymers. Alternatively, upper layer 42 may be formed from a low-permittivity ("low-k") dielectric, generally known in the art as a dielectric having a dielectric constant of less than about 3.5. One low-k dielectric in current use, which is believed to make a conformal film, is fluorine-doped silicon dioxide. Upper layer 42 may also be undoped or may be doped to form, for example, low doped borophosphorus silicate glass (BPSG), low doped phosphorus silicate glass (PSG), or fluorinated silicate glass (FSG). Low doped BPSG may have a boron concentration of less than approximately 5% by weight. Low doped PSG may have a phosphorus concentration of less than approximately 10% by weight, and more preferably less than approximately 5% by weight.

In an embodiment in which upper layer 42 includes different polishing characteristics than that of semiconductor 20, an underlying layer including a variation of polishing characteristics may be formed. The patterned underlying layer may be defined as the portion of semiconductor topography 37 comprising laterally adjacent materials of varied polishing characteristics. For example, the patterned underlying layer 41 may be the portion of semiconductor topography 37 comprising semiconductor layer 20 and laterally adjacent regions of upper layer 42. In this manner, upper layer 42 may comprise silicon dioxide and semiconductor layer 20 may comprise silicon. Alternatively, patterned underlying layer 43 may be the portion of semiconductor topography 37 comprising layer 34 and laterally adjacent regions of upper layer 42, when layer 34 comprises silicon nitride and upper layer 42 includes a dielectric such as oxide.

Furthermore, upper layer 42 may be deposited conformally and thus, may have a non-planar upper surface as shown in FIG. 4. Alternatively, upper layer 42 may be relatively planar if the underlying structures and layers are substantially planar before the deposition of upper layer 42. Preferably, upper layer 42 may be formed upon semiconductor topography 37 of FIG. 4 such that the entirety of the upper surface of upper layer 42 is spaced above semiconductor 20. Forming upper layer 42 to such a thickness allows semiconductor topography 37 to be subsequently polished to a substantially planar surface spaced above semiconductor layer 20. In one embodiment, upper layer 42 may be formed to such a thickness that the entirety of the upper surface of upper layer 42 may be spaced above trenches 40. Trenches 40 refer to the depressions formed within the semiconductor topography 37 by the etch process of FIG. 3. Consequently, the height of the trenches may depend upon the layers present during the etch process. As such, FIG. 4 illustrates the entirety of the upper surface of upper layer 42 above the upper surface of layer 34. However, upper layer 42 may be deposited in a manner such that the entirety of its upper surface may be above the upper surface of semiconductor layer 20, but below the upper surface of intermediate layer 33. Such an embodiment may be particularly beneficial when layer 34 includes a material comprising a higher etch rate characteristic than that of upper layer 42, i.e., doped oxide material. The faster etch rate of the doped oxide as compared to upper layer 42 may subsequently form isolation regions essentially co-planar with semiconductor layer 20. Alternatively, isolation regions with positive step heights may result due to the difference in etch rate characteristics.

Subsequent to FIG. 4, semiconductor topography 37 may be polished to an elevation above semiconductor layer 20 to prevent polishing underlying layer 41 or 43. As such, the polishing process may be designed to terminate at an elevation above semiconductor layer 20 to prevent the occurrence of dishing of subsequently formed shallow isolation trench regions. Damage to the silicon surrounding the isolation regions may also be prevented. In one embodiment, the polishing process may be programmed to polish for a predetermined period of time. In such an embodiment, a substantially planar surface may not be formed upon termination of the polishing process if the upper surface of upper layer 42 is not sufficiently above trenches 40 prior to polishing. Alternatively, upper layer 42 may be thick enough for the polishing process to form a substantially planar surface spaced above underlying layer 41 or 43. A layer sufficiently above an underlying layer may be defined as a layer thick enough in which a substantially planar surface may be formed within the layer during a polishing process.

The planarity of a surface may be defined by the elevational variation of the upper surface across the entirety of semiconductor topography 37 with respect to an underlying plane within the topography. In an embodiment, a substantially planar surface may be defined as an upper surface with an elevational variation of approximately 200 angstroms or less across the entirety of the semiconductor topography.

In a preferred embodiment, the polishing process may significantly reduce its polishing rate above an underlying layer of varying polishing characteristics. Such a reduction in the polishing rate may be accomplished through the use of a fixed abrasive polishing process. The fixed abrasive polishing process may reduce its polishing rate upon forming a substantially planar surface. As such, a fixed abrasive polishing process may be programmed to run longer than a CMP process. Such an over polishing technique may be used to insure that a substantially planar surface has been obtained. Alternatively, the polishing process may be designed to automatically terminate upon indication of a significant reduction in the polishing rate. In an embodiment, this may be accomplished through flatness detection of the semiconductor topography during the polishing process. Such detection may include, for example, monitoring the current drawn by the motor or the concentration of the effluent. These detection methods may also be used to pre-calibrate timed processes. Consequently, the method as described herein may be designed such that the upper surface of upper layer 42 subsequent to polishing may be spaced sufficiently above underlying layer 41 or 43 to avoid polishing the underlying layer and thereby preventing dishing of the underlying layer. Furthermore, the thickness of upper layer 42 may be optimized to allow the polishing process to terminate on its own, and yet minimize the elevation of the polished underlying layer 41 or 43. In one embodiment, the upper surface of semiconductor topography 37 subsequent to polishing may be spaced above an underlying layer by an amount between approximately 100 angstroms and approximately 1000 angstroms. Thicknesses lower than this range may be undesirably thin, since it may be difficult to control the polishing process to this thickness consistently. Thicknesses larger than this range may be undesirably thick, since more material will have to be subsequently etched. In a preferred embodiment, the upper surface of semiconductor topography 37 subsequent to polishing may be approximately 500 angstroms above an underlying layer.

To avoid the problems associated with conventional CMP processes, a fixed abrasive polishing process may be employed to polish semiconductor topography 37 in the method as described herein. The fixed abrasive process involves placing a fluid, which is substantially free of particulate matter between the surface of the topography and an abrasive polishing surface of a rotating polishing pad. Alternatively, the process may be substantially free of fluid completely. The polishing surface may include a polymer-based matrix entrained with particles selected from the group consisting of cerium oxide, cerium dioxide, aluminum oxide, silicon dioxide, titanium oxide, chromium oxide, and zirconium oxide. The fluid applied to the polishing surface in a fixed abrasive process may include deionized water or a reactive fluid such as a base diluted with water, depending upon the features of the topography being polished. The fluid may be used to wash away contaminants resulting from the polishing process. However, a fluid comprising a reactive substance may limit the ability of the process to significantly reduce the polishing rate upon forming a substantially planar surface.

An etching process may follow the polishing process by etching the entirety of the upper surface of the topography simultaneously to expose semiconductor layer 20 and laterally adjacent isolation regions. In this manner, the etch process allows semiconductor layer 20 to be exposed, but does not produce dishing of isolation regions. Etch methods may include the use of wet etch chemistries or dry etch techniques. As discussed below, the etch process may include a single etch step or a series of etch steps. In either embodiment, the method may include an initial etch step which etches the entire lateral upper surface of semiconductor topography 37 at one time. The initial etch step may include, for example, subjecting semiconductor topography 37 to an etch chemistry comprising hydrofluoric acid. In this manner, a non-selective removal of exposed oxide material may be conducted. Alternatively, other etch chemistries known to those in the art may be used.

Figure 5:
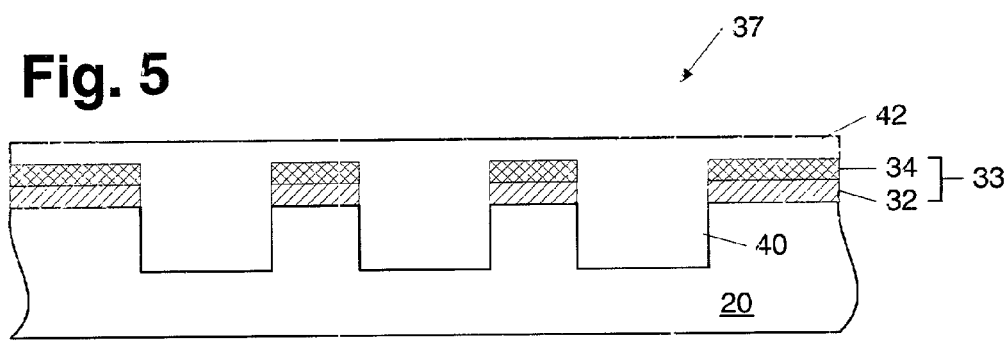
FIG. 5 depicts a partial cross-sectional view of the semiconductor topography in which the upper layer is polished to an elevation above the intermediate layer subsequent to the upper layer formation of FIG. 4.

FIGS. 5–12 illustrate exemplary embodiments of the method as described herein subsequent to the deposition of upper layer 42 in FIG. 4. The embodiments illustrate polishing upper layer 42 to different elevations above trenches 40 followed by an etch process to form shallow trench isolation regions. For example, the embodiment of FIG. 5 illustrates a polishing process terminating at an elevation above intermediate layer 33, particularly above underlying layer 43. This embodiment may be particularly useful when layer 34 comprises a material of significantly different polishing characteristics than that of upper layer 42, e.g., silicon nitride when layer 42 is oxide. Since polishing such a material may undesirably cause dishing of the regions of upper layer 42 laterally adjacent to such a material, the polishing process preferably terminates at an elevation above underlying layer 43 when layer 34 comprises such a material. In this manner, when layer 34 comprises silicon nitride, it is not a polish stop layer, but rather a portion of an underlying layer comprising a variation of polishing characteristics. Such a layer may be useful in establishing a desired step height for a completed shallow trench isolation structure. Alternatively, layer 34 may include any of the materials discussed in FIG. 1. In either embodiment, the upper surface of the topography does not include a polish stop material subsequent to polishing.

Figure 6:
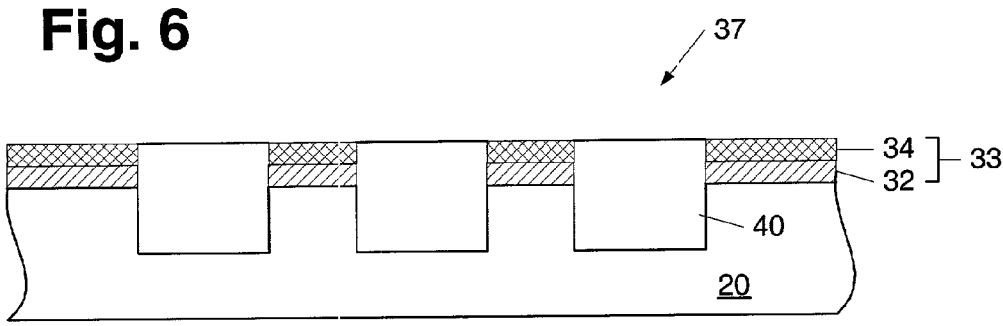
FIG. 6 depicts a partial cross-sectional view of the semiconductor topography in which the entire upper surface of the upper layer is etched subsequent to the upper layer polishing of FIG. 5.
Figure 7:
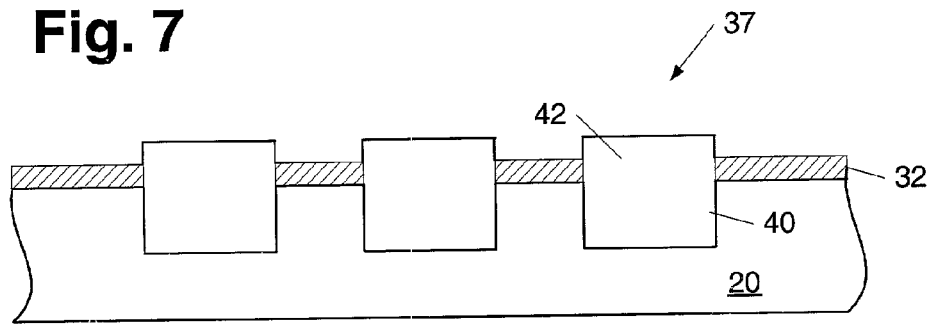
FIG. 7 depicts a partial cross-sectional view of the semiconductor topography in which an upper portion of the intermediate layer is etched subsequent to the upper surface etching of FIG. 6.
Figure 8:
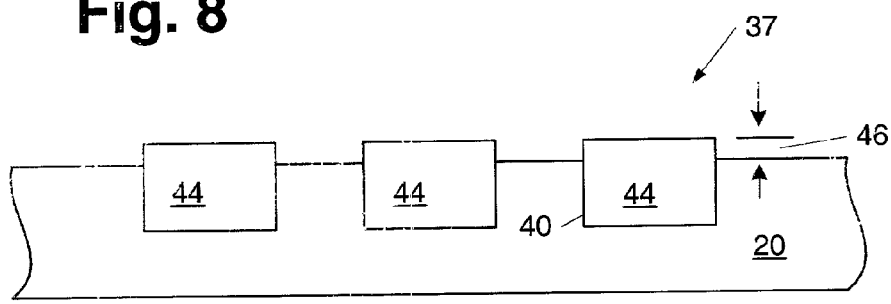
FIG. 8 depicts a partial cross-sectional view of the semiconductor topography in which remaining portions of the intermediate layer are etched to form isolation regions subsequent to the upper portion etching of FIG. 5.

As illustrated in FIG. 6, the entirety of upper layer 42 residing above layer 34 may be etched simultaneously. The simultaneous etch process may etch through a portion or the entirety of intermediate layer 33 in addition to etching through the entirety of upper layer 42 residing above the upper surface of layer 34. However, in an embodiment in which upper layer 34 comprises silicon nitride, the simultaneous etch process preferably terminates upon the upper surface of layer 34. In such an embodiment, a subsequent etch process selective to layer 34 may be employed as illustrated in FIG. 7. In such an etch process, layer 34 may be etched at a substantially faster rate than laterally adjacent portions of upper layer 42. As such, the upper surface of upper layer 42 may be above the upper surface of layer 32. A third etch step may then be employed in FIG. 8 to etch layer 32 and upper layer 42 simultaneously, such that isolation regions 44 may be formed. In particular, the remaining portions of upper layer 42 may be laterally confined within trenches 40. The 3-step etch process of FIGS. 6–8 may form step height 46, which is the portion of isolation regions 44 residing above semiconductor layer 20. Preferably, the upper surface of the remaining portion of upper layer 42 may be less than approximately 200 angstroms above the top of trenches 40. In one embodiment, the upper surface of the remaining portions of upper layer 42 may be less than approximately 50 angstroms above the top of trenches 40. Such step heights of minimal thickness formed above semiconductor 20 may offer the additional benefit of preventing poly stringers from forming during subsequent processing, while insuring that the active regions of the semiconductor topography are sufficiently isolated.

Figure 9:
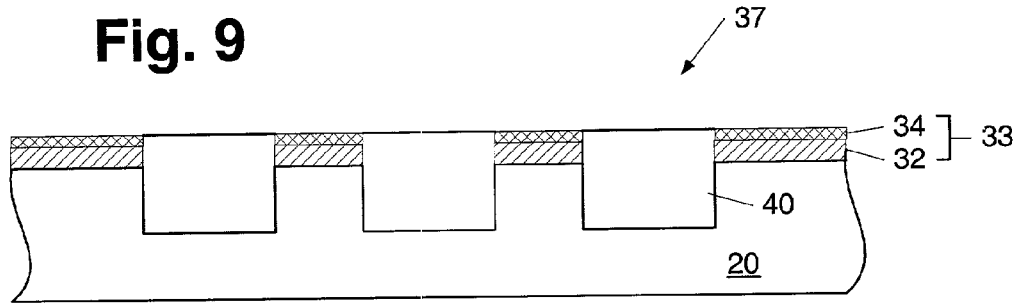
FIG. 9 depicts a partial cross-sectional view of the semiconductor topography in an alternative embodiment, in which the upper layer is polished to an elevation within an upper portion of the intermediate layer, subsequent to the upper layer formation of FIG. 4.
Figure 10:
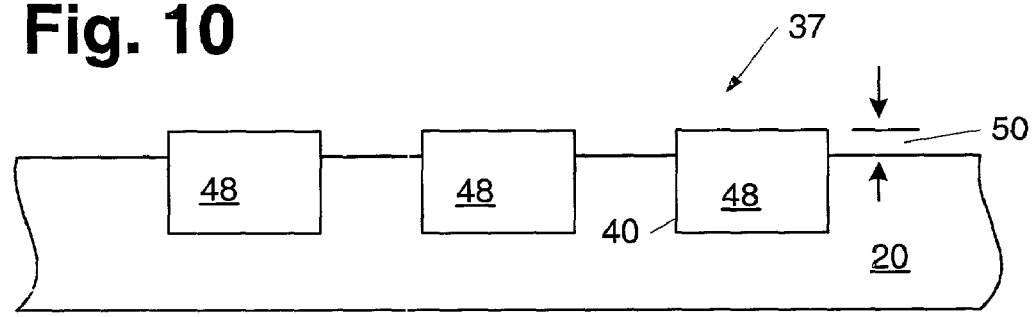
FIG. 10 depicts a partial cross-sectional view of the semiconductor topography in which remaining portions of the intermediate layer are etched to form isolation regions subsequent to the upper layer polishing of FIG. 9.

In an alternative embodiment, the polishing process may be designed to terminate at an elevation within intermediate layer 33. As such, the polishing process may terminate above or within intermediate layer 33, including above or within dielectric 32 and/or layer 34. In this manner, the polishing of underlying layer 42 may be substantially terminated upon exposing layer 34 or dielectric 32. Consequently, structures or layers formed upon semiconductor layer 20 laterally adjacent to intermediate layer 33 may also be polished to approximately the same elevation level as intermediate layer 33. In this manner, intermediate layer 33 may serve as an additional layer upon which the polishing process may terminate above or within. FIG. 9 illustrates a polishing process, which polishes upper layer 42 to an elevation within layer 34. In such an embodiment, layer 34 may include any material with similar polishing characteristics to those of upper layer 42. For example, layer 34 may include a layer of doped silicon. In such an embodiment, layer 34 may be etched at a faster rate than lateral portions of upper layer 42. FIG. 10 illustrates such an etch process, thereby etching layer 34, underlying 32, and laterally adjacent regions of upper layer 42 to form isolation regions 48. As shown in FIG. 10, step height 50 may be formed due to the different etch characteristics of layer 34 and upper layer 42. The thickness of step height 50 may depend on the thickness of layer 34 and 32 in FIG. 9. As with step height 46 of FIG. 8, step height 50 is preferably less than approximately 200 angstroms above the top of trenches 40. In one embodiment, the upper surface of the remaining portions of upper layer 42 may be less than approximately 50 angstroms above the top of trenches 40. Alternatively, the upper surface isolation regions 48 may be substantially coplanar with the upper surface of semiconductor layer 20 or below the upper surface of semiconductor layer 20 (not shown).

Figure 11:
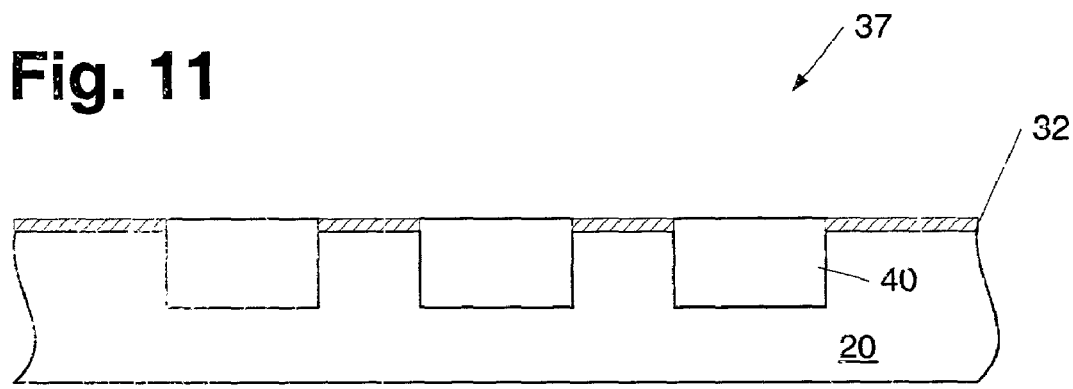
FIG. 11 depicts a partial cross-sectional view of the semiconductor topography in an alternative embodiment, in which the upper layer is polished to an elevation within a lower portion of the intermediate layer, subsequent to the upper layer formation of FIG. 4.
Figure 12:
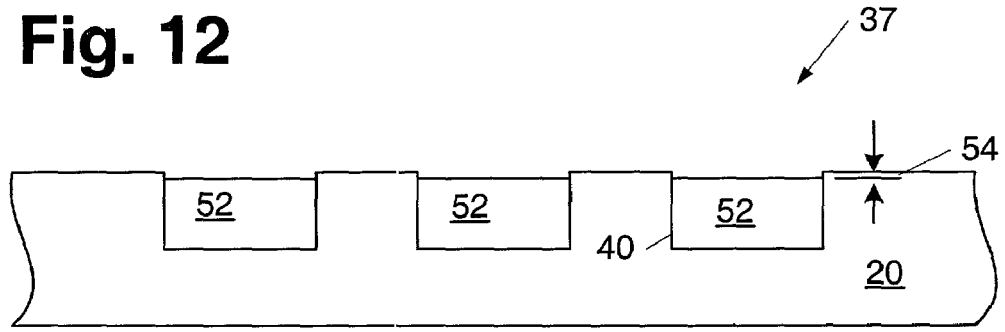
FIG. 12 depicts a partial cross-sectional view of the semiconductor topography in which remaining portions of the intermediate layer are etched to form isolation regions subsequent to the upper layer of polishing FIG. 11.

FIG. 11 illustrates a polishing process which polishes upper layer 42 subsequent to FIG. 4 to an elevation within layer 32. In such an embodiment, the polishing process may polish through layer 34 or alternatively, layer 34 may have been omitted from the formation of the topography. The entirety of the polished upper surface may then be etched as illustrated in FIG. 12 to form isolation regions 52. In an embodiment in which layer 32 comprises a grown oxide, layer 32 may etch at slightly slower rate than the deposited dielectric material of upper layer 42. As such, a negative step height may result as shown in FIG. 12. More specifically, the upper surface of upper layer 42 may be below the upper surface of semiconductor layer 20. However, step height 54 may be minimal such that laterally adjacent active devices may still be sufficiently isolated. Preferably, the upper surfaces of isolation regions 52 may be less than 200 angstroms below the upper surface of semiconductor layer 20. In one embodiment, the upper surfaces of isolation regions 52 may be less than 50 angstroms below the upper surface of semiconductor layer 20. Alternatively, the upper surfaces of isolation regions 52 may be substantially coplanar with the upper surface of semiconductor layer 20 (not shown).

Although discussed above with reference to shallow trench isolation, the methods described herein may be useful in other applications involving polishing of dielectrics. In particular, methods described herein are believed to be useful for cases in which a dielectric to be polished is arranged above a layer having a lateral variation in polishing characteristics, and exposure of this layer is desired. Termination of polishing above the layer and exposure of the layer by etching may prevent undesirable effects such as polish damage or dishing. This type of application may arise, for example, during polishing of gap-fill dielectrics used between, e.g., transistor gates or interconnect lines, or between features in micro-electro-mechanical system (MEMS) structures. The methods described herein may therefore allow elimination of polish stop layers for applications other than the shallow trench isolation embodiments described above. In cases for which an additional layer beneath a dielectric to be polished is used both as a polish stop and for other purposes (such as an etch stop, or a layer to establish a subsequent step height), removal of the need for a polish stop may allow a reduction in thickness for such an additional layer.

It will be appreciated to those skilled in the art having the benefit of this disclosure that this invention is believed to provide a method and a system for processing a semiconductor topography. Further modifications and alternative embodiments of various aspects of the invention will be apparent to those skilled in the art in view of this description. For example, the methods described herein could be applied not just to polishing a layer formed upon a semiconductor layer, but to polishing various features or layers occurring in semiconductor fabrication. It is intended that the following claims be interpreted to embrace all such modifications and changes and, accordingly, the drawings and the specification are to be regarded in an illustrative rather than a restrictive sense.

What is claimed is:

1. A method for fabricating a shallow trench isolation region, comprising:
   forming an intermediate layer upon an upper surface of a semiconductor topography, wherein the intermediate layer comprises a doped oxide layer;
   forming one or more trenches within the intermediate layer and the semiconductor topography;
   blanket depositing a trench fill material over and within the one or more trenches;
   polishing the trench fill material with an abrasive polishing surface in the absence of a fluid or in the presence of a fluid that is substantially free of particulate matter to form an upper surface at an elevation above the trenches, wherein the upper surface does not comprise a polish stop material; and
   etching an entirety of the upper surface simultaneously, wherein remaining portions of the trench fill material are laterally confined within the trenches.

2. The method of claim 1, wherein an tipper surface of the remaining portions is above an upper surface of a semiconductor substrate within the semiconductor topography.

3. The method of claim 2, wherein said upper surface of the remaining portions is less than approximately 200 angstroms above the tipper surface of the semiconductor substrate.

4. The method of claim 1, wherein the step of polishing comprises inserting a fluid consisting essentially of water between the trench fill material and the abrasive polishing surface.

5. The method of claim 1, wherein said etching comprises etching at least a portion of the doped oxide layer.

6. The method of claim 1, wherein said intermediate layer further comprises a base oxide layer.

7. The method of claim 1, wherein said doped oxide layer comprises borophosphosilicate glass.

8. The method of claim 1, wherein said intermediate layer further comprises a nitride layer, and wherein a thickness of said nitride layer is less than approximately 500 angstroms.

9. A method for processing a semiconductor topography, comprising:
   polishing an upper layer of said semiconductor topography with an abrasive polishing surface in the presence of a fluid that is substantially free of particulate matter to form an upper surface of the semiconductor topography at an elevation above an underlying layer, wherein the underlying layer comprises a lateral variation in polishing characteristics, and wherein the step of polishing comprises inserting a fluid consisting essentially of water between the semiconductor topography and the abrasive polishing surface; and
   etching the entirety of the upper surface of the semiconductor topography simultaneously to expose the underlying layer.

10. The method of claim 9, wherein said upper surface of the semiconductor topography is spaced sufficiently above the underlying layer to avoid dishing during said polishing.

11. The method of claim 9, wherein said upper surface of the semiconductor topography is spaced sufficiently above the underlying layer to avoid polishing the underlying layer.

12. The method of claim 9, wherein said elevation is between approximately 100 angstroms and approximately 1000 angstroms.

13. The method of claim 9, wherein said upper layer comprises an interlevel dielectric layer.

14. The method of claim 13, wherein said interlevel dielectric layer comprises silicon dioxide.

15. The method of claim 9, wherein said underlying layer comprises a silicon substrate patterned with dielectric filled trenches.

16. The method of claim 9, further comprising:
   forming an intermediate layer upon an upper surface of the semiconductor topography;
   forming one or more trenches within the intermediate layer and the semiconductor topography; and
   blanket depositing the upper layer over and within the one or more trenches prior to the step of polishing the upper layer.

17. The method of claim 16, wherein the intermediate layer comprises a doped oxide layer.

18. The method of claim 17, wherein said doped oxide layer comprises borophosphosilicate glass.

19. The method of claim 16, wherein said intermediate layer comprises a nitride layer with a thickness of less than approximately 500 angstroms.

20. The method of claim 16, wherein said intermediate layer further comprises a silicon carbide layer.

21. The method of claim 16, wherein said intermediate layer further comprises a carbonated polymer layer.

22. A method for fabricating a shallow trench isolation region, comprising:
   forming an oxide layer upon and in contact with a substrate comprising silicon;
   forming one or more trenches within the oxide layer and the substrate;
   blanket depositing a fill material within the one or more trenches and upon and in contact with remaining portions of the oxide layer;
   polishing the fill material with an abrasive polishing surface in the absence of a fluid or in the presence of a fluid that is substantially free of particulate matter to form a substantially planar surface at an elevation above an uppermost surface of the substrate; and etching an entirety of the substantially planar surface simultaneously to expose the substrate.

23. The method of claim 22, wherein the step of forming the oxide layer comprises growing the oxide layer by thermal oxidation of the substrate.

24. The method of claim 22, wherein the step of forming the oxide layer comprises depositing the oxide layer by chemical vapor deposition techniques.

25. The method of claim 22, wherein the oxide layer consists essentially of silicon oxide.

26. The method of claim 22, wherein the oxide layer consists essentially of siliconoxynitride.

27. The method of claim 22, wherein said elevation is between approximately 100 angstroms and approximately 1000 angstroms above the uppermost surface of the substrate.

28. The method of claim 22, wherein the stop of forming the oxide layer comprises forming the oxide layer to have a thickness between approximately 50 angstroms and approximately 250 angstroms.

29. The method of claim 22, wherein the step of polishing comprises inserting a fluid consisting essentially of water between the fill material and the abrasive polishing surface.

30. The method of claim 22, wherein the step of polishing comprises polishing at least a portion of the oxide layer.

* * * * *

UNITED STATES PATENT AND TRADEMARK OFFICE
CERTIFICATE OF CORRECTION

| | | |
|---|---|---|
| PATENT NO. | : 6,969,684 B1 | Page 1 of 1 |
| APPLICATION NO. | : 09/846119 | |
| DATED | : November 29, 2005 | |
| INVENTOR(S) | : Gilboa et al. | |

It is certified that error appears in the above-identified patent and that said Letters Patent is hereby corrected as shown below:

In the Claims:

Col. 15
line 51, delete "tipper" and substitute therefor --upper--.
line 56, delete "tipper" and substitue therefor --upper--.

Signed and Sealed this

Seventh Day of November, 2006

JON W. DUDAS
*Director of the United States Patent and Trademark Office*